(12) United States Patent
Iwawaki

(10) Patent No.: US 7,084,000 B2
(45) Date of Patent: Aug. 1, 2006

(54) SOLID-STATE IMAGING DEVICE AND METHOD FOR MANUFACTURING THE SAME

(75) Inventor: Naoki Iwawaki, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 6 days.

(21) Appl. No.: 11/005,733

(22) Filed: Dec. 7, 2004

(65) Prior Publication Data

US 2005/0127413 A1 Jun. 16, 2005

(30) Foreign Application Priority Data

Dec. 16, 2003 (JP) .............................. 2003-418476

(51) Int. Cl.
*H01L 21/00* (2006.01)

(52) U.S. Cl. ............................ 438/60; 438/57; 438/59; 438/61; 438/75; 438/114; 257/E21.297; 257/E21.316; 257/E21.412; 430/57.4

(58) Field of Classification Search .................. 438/57, 438/59–61, 75, 114; 257/E21.297, E21.316, 257/E21.412; 430/57.4
See application file for complete search history.

(56) References Cited

U.S. PATENT DOCUMENTS

| | | | |
|---|---|---|---|
| 5,904,494 A | 5/1999 | Hokari et al. | |
| 6,495,387 B1 * | 12/2002 | French | ......................... 438/52 |
| 6,841,411 B1 * | 1/2005 | Varghese | ..................... 438/94 |

FOREIGN PATENT DOCUMENTS

JP 9-283733 10/1997

OTHER PUBLICATIONS

R.M. Anderson et al., "Evidence for surface asperity mechanism of conductivity in oxide grown on polycrystalline silicon", Journal of Applied Physics., vol. 48, No. 11, p. 4, 834 (Nov. 1977).

K. Shinada et al., "Reduction in Polysilicon Oxide Leakage Current by Annealing prior to Oxidation", J. Electrochem. Soc., vol. 132, No. 9, p. 2, 185 (Sep. 1985).

D.K. Brown et al., "Ramp Breakdown Study of Double Polysilicon RAM's as a Function of Fabrication Parameters", J.Electrochem. Soc., vol. 130, No. 7, p. 1,597 (Jul. 1983).

* cited by examiner

*Primary Examiner*—George Fourson
*Assistant Examiner*—Thanh V. Pham
(74) *Attorney, Agent, or Firm*—Hamre, Schumann, Mueller & Larson, P.C.

(57) ABSTRACT

A solid-state imaging device according to the present invention includes a semiconductor substrate; a photoelectric conversion portion formed on the semiconductor substrate; a gate insulating film formed on the semiconductor substrate and covering the photoelectric conversion portion; a vertical transfer portion for transferring a charge generated at the photoelectric conversion portion in a vertical direction; and a multilayer transfer gate electrode for transferring the charge of the vertical transfer portion. At least one layer of the multilayer transfer gate electrode is made of at least two impurity doped amorphous silicon films of different impurity concentration. Thus, the solid-state imaging device and a method of manufacturing the same that tend to develop no local potential barrier in the transfer channel, enhance the yield, improve the withstand voltage of the insulating film that is sandwiched between electrodes, and prevent the leakage of light and the step interruption of the metal conductors due to local thinning of the light-blocking film are provided.

8 Claims, 7 Drawing Sheets

SOLID-STATE IMAGING DEVICE AND METHOD FOR MANUFACTURING THE SAME

BACKGROUND OF THE INVENTION

1. Field of the Invention

The present invention relates to solid-state imaging devices. The present invention relates especially to solid-state imaging devices with improved gate electrode portions and to methods for manufacturing the same.

2. Background of the Invention

Various conventional solid-state imaging devices have been proposed (JP H9-283733A, for example). A conventional solid-state imaging device is explained with reference to FIG. 6. An n-type impurity diffusion region 3, a vertical register 4, and a p-type channel stopper region 5 are formed on an n-type silicon substrate 1 inside a first p-type well region 2. A p-type positive charge accumulation region 6 is formed on the n-type impurity diffusion region 3. A second p-type well region 7 is formed directly below the vertical register 4.

Here, a light-receiving portion (photoelectric conversion portion) 8 is configured by a photodiode that is made of a PN junction of the n-type impurity diffusion region 3 and the first p-type well region 2. The light-receiving portion 8 is formed in correspondence to a pixel.

Next, a gate insulating film 9 is formed on the entire surface, including the channel stopper region 5, the vertical register 4, and the positive charge accumulation region 6 of the first p-type well region 2. Furthermore, a first transfer gate electrode 10 and a second transfer gate electrode 11, made with doped amorphous silicon, and a silicon oxide film 12, are formed on the gate insulating film 9 above the first p-type well region 2. A metal light-blocking film 13 is then selectively formed on the first transfer gate electrode 10, the second transfer gate electrode 11, and the silicon oxide film 12.

The first transfer gate electrode 10 and the second transfer gate electrode 11 of the above structure are manufactured by the following process shown in FIGS. 7A–D. After forming the gate insulating film 9 on the entire surface of the n-type silicon substrate 1 by utilizing an oxidation furnace and a LPCVD reactor, a first n-type doped amorphous silicon film 14 with a thickness of about 0.5 μm is formed on the entire surface of the gate insulating film 9 in one layer at a uniform concentration (approximately $7.0 \times 10^{20}$ cm$^{-3}$) inside the LPCVD reactor by utilizing the thermal decomposition shown in the chemical reaction (1) below (FIG. 7A).

$$PH_3 + SiH_4 \rightarrow Si(\text{phosphorus diffusion}) + 2H_2 \quad (1)$$

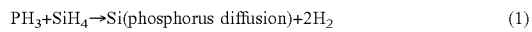

Next, the first transfer gate electrodes 10 are formed by photolithography and etching, leaving a gate region and a gate wiring region of the first doped amorphous silicon film 14 as is.

The first transfer gate electrodes 10 are then oxidized with the oxidation furnace to form the silicon oxide film 12 (FIG. 7B). A second n-type doped amorphous silicon film 15 with a thickness of about 0.5 μm is formed on the entire surface in one layer at a uniform concentration (approximately $7.0 \times 10^{20}$ cm$^{-3}$) inside the LPCVD reactor by utilizing the thermal decomposition shown in the chemical reaction below (FIG. 7C).

$$PH_3 + SiH_4 \rightarrow Si(\text{phosphorus diffusion}) + 2H_2 \quad (2)$$

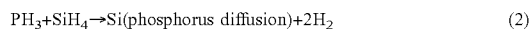

Next, the second transfer gate electrodes 11 are formed by photolithography and etching, leaving a gate region and a gate wiring region of the second doped amorphous silicon film 15 as is. The second transfer gate electrodes 11 are then oxidized with the oxidation furnace to form the silicon oxide film 12 (FIG. 7D).

However, the method for manufacturing the conventional solid-state imaging device has the following problems.

The first problem is the formation of local microcrystal regions 16 in the n-type impurity doped amorphous silicon layer when forming the first doped amorphous silicon film 14 or the second doped amorphous silicon film 15 on the entire surface in one layer with the n-type impurity doped amorphous silicon layer of a thickness of about 0.5 μm at a uniform concentration (approximately $7.0 \times 10^{20}$ cm$^{-3}$) by utilizing the thermal decomposition: $PH_3 + SiH_4 \rightarrow Si$ (phosphorus diffusion) $+ 2H_2$ inside the LPCVD reactor (FIG. 8A).

The etching rate of the microcrystal regions 16 is faster than that of other regions when the n-type impurity doped amorphous silicon layers that are formed on the entire surface are etched in the next step.

Therefore, though the probability is statistically low, the microcrystal regions 16 may form in the places where the microcrystal regions 16 are in contact with the gate insulating film 9 that is formed below when the n-type impurity doped amorphous silicon layers that are formed on the entire surface are etched. In this case, since the etching rate of these microcrystal regions 16 is faster than that of other regions, the gate insulating film 9 that is formed below is locally over-etched and locally thin regions 17 result on the gate insulating film 9 that is formed below (see FIG. 8B).

If the locally thin regions 17 of the gate insulating film 9 are formed at transfer register regions for charge transfer, then local potential barriers 18 develop in the transfer channel, the charge is trapped and the charge transfer may become incomplete (see FIG. 8C).

The second problem is the phenomenon of imaging defects that occurs at an average n-type impurity concentration of the n-type impurity doped amorphous silicon layer of $7.0 \times 10^{20}$ cm$^{-3}$, for example (FIG. 9A). The phenomenon occurs when the first doped amorphous silicon film 14 or the second doped amorphous silicon film 15 is formed on the entire surface in one layer with the n-type impurity doped amorphous silicon layer of a thickness of about 0.5 μm at a uniform concentration by utilizing the thermal decomposition: $PH_3 + SiH_4 \rightarrow Si$ (phosphorus diffusion) $+ 2H_2$ inside the LPCVD reactor (FIG. 9A). Numeral 16 in FIG. 9A denotes a microcrystal region.

The phenomenon can be explained with the following model. If the n-type impurity doped amorphous silicon layer is subjected to the thermal diffusion in the next step, then silicon grains 19 in the n-type impurity doped amorphous silicon layer grow and a high concentration of n-type impurities 21 occurs in the vicinity of silicon boundaries 20 of the grown silicon grains 19 (FIG. 9B).

As a result, there is a localized increase in the resistance of the n-type impurity doped amorphous silicon layer and an image defect akin to a broken conductor may occur by inhibition of the flow of electrons in the doped amorphous silicon layer or by the electrons remaining in the doped amorphous silicon layer.

As for the third problem, the second transfer gate electrode 11 of the conventional solid-state imaging device has the function of reading the charge from the light-receiving portion to the vertical register and another function of charge transfer within the vertical register, as illustrated in FIG. 6. Therefore, a maximum pulse voltage of about 25V is applied to the insulating film that insulates the first transfer gate electrode 10 and the second transfer gate electrode 11.

And although the insulating film (the silicon oxide film 12) is formed by thermal oxidation of the first transfer gate electrode 10, as explained in FIG. 7, the withstand voltage of the film obtained by subjecting the n-type impurity doped amorphous silicon to the thermal oxidation is generally weak and a field strength of about 1 to 2 Mv/cm is obtained. Therefore, in order to obtain a withstand voltage of 25 V, the thickness of the oxide film above the n-type impurity doped amorphous silicon needs to be in the order of at least 0.3 µm.

There is a need for the improvement in particular of conventional solid-state imaging devices with large surface area, in which withstand voltage defects of the oxide film greatly lower the yield. In FIG. 6, if the thickness of the oxide film is thick, then the level difference between the portion in which the first transfer gate electrode 10 and the second transfer gate electrode 11 are stacked and the light-receiving portion in which these electrodes are not formed becomes 1 µm.

Therefore, the metal light-blocking film 13 for blocking light that is provided on top of the electrodes may not cover the level difference well and the coverage may be thin in the level difference portion. If there is such a thin portion, then a false signal may arise and the S/N ratio may deteriorate because light may leak into the vertical register and the charge generated from photoelectric conversion in the vertical register 4 is added to the signal charge.

Furthermore, if the metal light-blocking film 13 for blocking light is used as a conductor, then the problem may occur that no voltage is applied because the conductor is cut at the level difference portion. From the above, there is a need for the formation of an insulating film that is thin and has withstand properties.

SUMMARY OF THE INVENTION

In order to solve the conventional problems, the present invention provides a solid-state imaging device and a method for manufacturing the same that tend to develop no local potential barriers in the transfer channel, enhance the yield, improve the withstand voltage of an insulating film sandwiched between electrodes, and prevent the leakage of light and the step interruption of the metal conductors due to local thinning of the light-blocking film.

A solid-state imaging device according to the present invention includes a semiconductor substrate; a photoelectric conversion portion formed on the semiconductor substrate; a gate insulating film formed on the semiconductor substrate and covering the photoelectric conversion portion; a vertical transfer portion for transferring a charge generated at the photoelectric conversion portion in a vertical direction; and a multilayer transfer gate electrode for transferring the charge of the vertical transfer portion. At least one layer of the multilayer transfer gate electrode is made of at least two impurity doped amorphous silicon films with different impurity concentration.

Next, in accordance with the present invention, in a method for manufacturing a solid-state imaging device including a semiconductor substrate; a photoelectric conversion portion formed on the semiconductor substrate; a gate insulating film formed on the semiconductor substrate and covering the photoelectric conversion portion; a vertical transfer portion for transferring a charge generated at the photoelectric conversion portion in a vertical direction; and a multilayer transfer gate electrode for transferring the charge of the vertical transfer portion; at least one layer of the multilayer transfer gate electrode is made of at least two impurity doped amorphous silicon films of different impurity concentration. The impurity doped amorphous silicon films are formed by a step of forming a first doped amorphous silicon film with a first impurity concentration; a step of etching the first doped amorphous silicon film into the shape of the transfer gate electrode; a step of forming a second doped amorphous silicon film with a second impurity concentration; and a step of etching the second doped amorphous silicon film into the shape of the transfer gate electrode.

DESCRIPTION OF THE PREFERRED EMBODIMENTS

With a solid-state imaging device of the present invention, microcrystal regions in n-type impurity doped amorphous silicon layers that are formed on entire surface do not directly contact the gate insulating film that is formed below, and no locally thin regions are formed in the gate insulating film below, so that it is possible to prevent the occurrence of a potential barrier in a transfer channel. Furthermore, it is possible to prevent a localized increase in the resistance of the n-type impurity doped amorphous silicon layer and the occurrence of the image defects akin to broken conductors due to inhibition of the flow of electrons in the n-type impurity doped amorphous silicon layer or due to electrons remaining in the n-type impurity doped amorphous silicon layer. It is thus possible to improve the yield. It is also possible to reduce the thickness of an n-type impurity doped amorphous silicon oxide film by improving the withstand voltage of the insulating film that is sandwiched between the electrodes made of the multilayered n-type impurity doped amorphous silicon. Furthermore, it is possible to prevent the leakage of light and the step interruption of the metal conductors due to local thinning of the light-blocking film, because the level difference at the doped amorphous silicon electrode end portion can be reduced.

Figure 1:
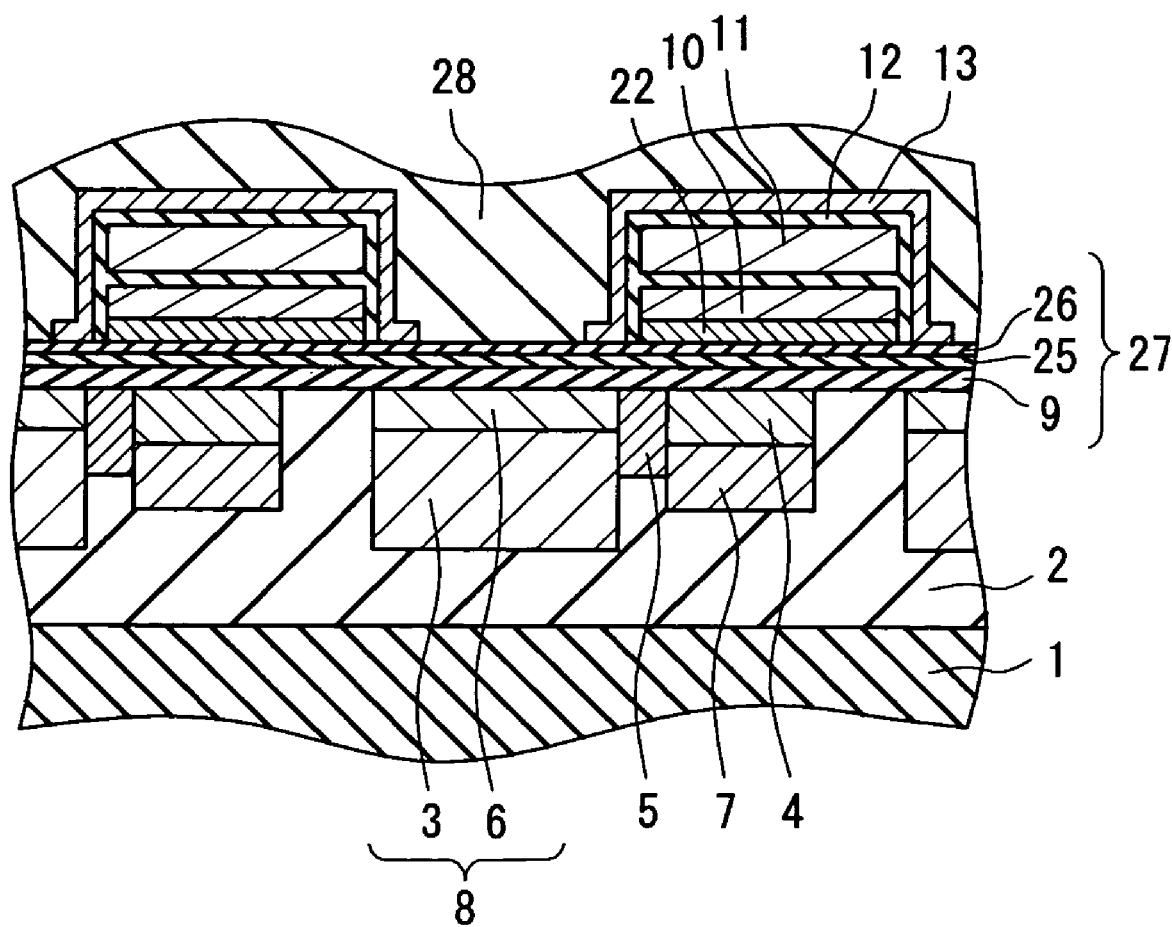
FIG. 1 is a cross-sectional view that illustrates a manufacturing process of an embodiment of the present invention.

In accordance with the present invention, a multilayer transfer gate electrode is formed and at least one layer of the multilayer transfer gate electrode is made of at least two impurity doped amorphous silicon films of different impurity concentration. FIG. 1 shows a specific example, in which multilayer gate electrodes (a first transfer gate electrode 10 and a second transfer gate electrode 11) are formed via an insulating film such as a silicon oxide film 12, and the first transfer gate electrode 10 is formed by laminating two impurity doped amorphous silicon layers of different impurity concentration. It is preferable that the impurity concentration of the inside layer is either at least $7.0 \times 10^{20}$ cm$^{-3}$ or $0 \times 10^{20}$ cm$^{-3}$ (the amount of dopant is zero) and the impurity concentration of the outside layer is at least $1.0 \times 10^{20}$ cm$^{-3}$ and at most $3.0 \times 10^{20}$ cm$^{-3}$.

In the solid-state imaging device of the present invention, it is preferable that the average impurity concentration of the n-type impurity doped amorphous silicon film is at least $1.0 \times 10^{20}$ cm$^{-3}$ and at most $3.0 \times 10^{20}$ cm$^{-3}$. If the average impurity concentration is in this range, then the electrical resistance is appropriate and a uniform layer can be formed. If the n-type average impurity concentration is less than $1.0 \times 10^{20}$ cm$^{-3}$, then the resistance of the n-type impurity doped amorphous silicon film becomes too high. Also, if the n-type average impurity concentration is greater than $3.0 \times 10^{20}$ cm$^{-3}$, then silicon grains in the n-type impurity doped amorphous silicon layer grow and a high concentration of n-type impurity occurs in the vicinity of the silicon boundaries of the grown silicon grains, so that the resistance of the n-type impurity doped amorphous silicon layer increases locally and in turn an image defect akin to a broken conductor may occur due to inhibition of the flow of electrons in the doped amorphous silicon layer or due to the electrons remaining in the doped amorphous silicon layer.

At least one layer of the multilayer transfer gate electrode is made of at least two impurity doped amorphous silicon films of different impurity concentration. It is preferable that the difference in impurity concentration between a layer closest to a gate insulating film 9 and a layer(s) other than this layer is at least $1.0 \times 10^{20}$ cm$^{-3}$ and at most $6.0 \times 10^{20}$ cm$^{-3}$.

It is preferable that the gate insulating film is formed by a 3-layer structure of silicon oxide film-silicon nitride film-silicon oxide film. That is, it is preferable that if the solid-state imaging device has a multilayer transfer gate electrode, then the n-type well potential directly below each layer of the transfer gate electrode is the same. For that purpose, it is necessary to make the thickness of the gate insulating film of each layer the same while suppressing the oxidation of the silicon substrate formed below even when the transfer gate electrodes are thermally oxidized. The gate insulating film may be a multilayer structure including a silicon nitride film such as the 3-layer structure of silicon oxide film/silicon nitride film/silicon oxide film, for example. By forming the silicon nitride film, it is possible to suppress the oxidation from proceeding into the silicon substrate that is formed below. It should be noted that if a silicon nitride film is formed on top of a silicon oxide film, then electrons are accumulated at the silicon oxide film/silicon nitride film interface due to the difference between electron mobility in the silicon oxide film and the silicon nitride film, but the accumulation of the electrons can be prevented and the reliability can be improved by forming another silicon oxide film on top of the silicon nitride film, thus attaining a 3-layer structure of silicon oxide film/silicon nitride film/silicon oxide film.

In the method of the present invention, it is preferable that at least one layer of the multilayer transfer gate electrode further is formed by a step of diffusing a concentration of n-type impurities that is higher than that of the first and second doped amorphous silicon films into the surface of a transfer gate electrode in at least one layer of the multilayer transfer gate electrode and a step of forming a silicon oxide film by thermally oxidizing the transfer gate electrode. If there is no step of diffusing n-type impurities with a concentration that is higher than that of the first and second doped amorphous silicon film into the surface of the transfer gate electrode, then depressions and protrusions on the surface of the doped amorphous silicon at the interface portion of the doped amorphous silicon/oxide film become larger after the thermal oxidation. Furthermore, in the protruding corner portions of the doped amorphous silicon, the thickness of the oxide film in vicinity of the protruding corner becomes thin since the oxidation is suppressed as the stress accumulated in the doped amorphous silicon oxide film is concentrated in one region. If, however, a step of diffusing n-type impurities of a concentration that is higher than that of the first and second doped amorphous silicon films into the surface of the transfer gate electrode and a step of forming the silicon oxide film by thermally oxidizing the transfer gate electrode is performed, then it is possible to make the interface of the oxide film/doped amorphous silicon smooth by accelerating the thermal oxidation, fluidizing the silicon oxide film, and alleviating the mechanical distortion of the oxide film/doped amorphous silicon interface generated by the oxidation. Furthermore, at the protruding corner portions (the portions marked "Y" in FIGS. 5A and 5B) of the doped amorphous silicon, the withstand voltage of the oxide film is improved, because the concentrated stress accumulated in the doped amorphous silicon oxide film is improved by the viscous fluidity of the silicon oxide, the oxide film in vicinity of the protruding corner does not become thin, and the radius of curvature of the protruding corner portions becomes larger.

It is preferable that at least one layer of the multilayer transfer gate electrode is further formed by a step of thermally oxidizing the transfer gate electrode using water that is formed by hydrogen and oxygen ($2H_2 + O_2 \rightarrow 2H_2O$) at low pressure. If such a step of thermally oxidizing the transfer gate electrode using water that is formed by hydrogen and oxygen ($2H_2 + O_2 \rightarrow 2H_2O$) at low pressure is not included, then the protrusion and depressions on the surface of the doped amorphous silicon at the interface portion of the doped amorphous silicon/oxide film become larger after the thermal oxidation. Furthermore, in the protruding portion corners of the doped amorphous silicon, the thickness of the oxide film in vicinity of the protruding corner becomes thin since the oxidation is suppressed as the stress accumulated in the doped amorphous silicon oxide film is concentrated in one region. If, however, a step of thermally oxidizing the transfer gate electrode using water that is formed by hydrogen and oxygen ($2H_2 + O_2 \rightarrow 2H_2O$) at low pressure further is included, then it is possible to make the interface of the oxide film/doped amorphous silicon smooth by accelerating the thermal oxidation, fluidizing the silicon oxide film, and alleviating the mechanical distortion of the oxide film/doped amorphous silicon generated by the oxidation. Furthermore, at the protruding corner portions (the portions marked "Y" in FIGS. 5A and 5B) of the doped amorphous silicon, the withstand voltage of the oxide film is improved, because the concentrated stress accumulated in the doped amorphous silicon oxide film is improved by the viscous fluidity of the silicon oxide, the oxide film in vicinity of the protruding corner does not become thin, and the radius of curvature of the protruding corner portions becomes larger.

First Embodiment

A first embodiment of the method for manufacturing the solid-state imaging device according to the present invention is explained using FIGS. 2 to 4.

Figure 2A:
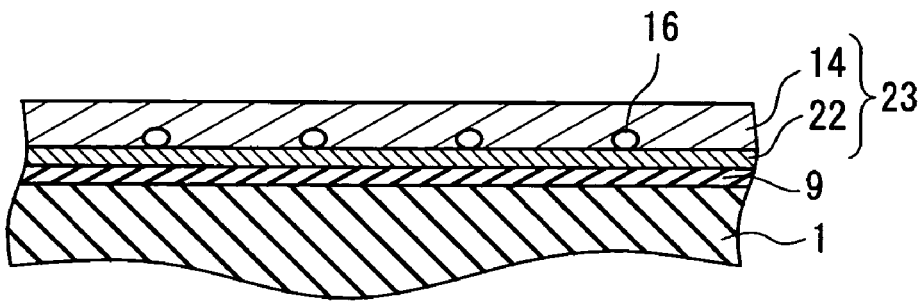
FIGS. 2A and 2B are cross-sectional views of a process in Embodiment 1 of the present invention.
Figure 2B:
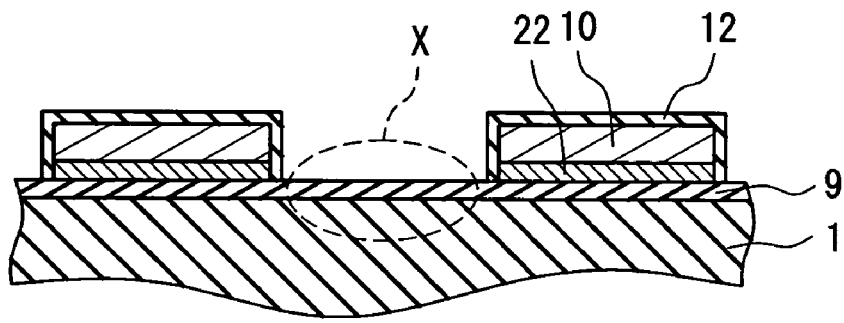

First, in a step of growing an n-type impurity doped amorphous silicon layer when forming a multilayer transfer gate electrode, a buffer layer 22 made of n-type impurity doped amorphous silicon is formed, as shown in FIGS. 2A and 2B. The thickness of the buffer layer 22 is 0.02 μm, for example, and the concentration of the buffer layer 22 is such that no microcrystal regions are formed locally (an undoped amorphous silicon layer or a doped amorphous silicon layer with an n-type impurity concentration of $7.0 \times 10^{20}$ cm$^{-3}$, for example). The buffer layer 22 is formed utilizing the thermal decomposition:

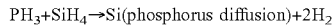

inside an LPCVD reactor.

Second, an n-type impurity doped amorphous silicon layer (first doped amorphous silicon layer) 14 of a desired n-type impurity concentration ($1.0 \times 10^{20}$ cm$^{-3}$ to $3.0 \times 10^{20}$ cm$^{-3}$, for example) is then formed in the same LPCVD reactor process. Thus, an n-type impurity doped amorphous silicon film 23 made of two or more amorphous silicon films with different n-type impurity concentration is formed (FIG. 2A).

By forming a buffer layer 22 with a thickness of about 0.02 μm and with such a concentration that no local microcrystal regions are formed (undoped amorphous silicon layer or doped amorphous silicon layer with n-type impurity concentration of $7.0 \times 10^{20}$ cm$^{-3}$, for example), as described above, it is possible to prevent or suppress locally thin regions from forming on the gate insulating film that is formed below by preventing or suppressing the local over-etching of the gate insulating film that is formed below even if microcrystal regions are present when etching the n-type impurity doped amorphous silicon layers that are formed on the entire surface in the next step (FIG. 2B). The X portion in FIG. 2B is a portion in which no locally thin regions are formed. It is preferable that in each n-type impurity doped amorphous silicon layer, the n-type impurity concentration of the first n-type impurity doped amorphous silicon layer with the thickness of 0.02 μm where no local microcrystal regions are formed is either 0 cm$^{-3}$ or $7.0 \times 10^{20}$ cm$^{-3}$ or more. If the n-type impurity concentration is 0 cm$^{-3}$, then no microcrystal regions are formed since there are no n-type impurities. Also, if the n-type impurity concentration is $7.0 \times 10^{20}$ cm$^{-3}$ or more, then no local clusters or microcrystal regions tend to be formed because the n-type impurity concentration is high. Furthermore, it is preferable that the n-type impurity concentration of the second n-type impurity doped amorphous silicon layer with the remaining thickness of 0.48 μm is at least $1.0 \times 10^{20}$ cm$^{-3}$ and at most $3.0 \times 10^{20}$ cm$^{-3}$. If the n-type impurity concentration is less than $1.0 \times 10^{20}$ cm$^{-3}$, then the resistance of the n-type impurity doped amorphous silicon film becomes too high. Also, if the n-type impurity concentration exceeds $3.0 \times 10^{20}$ cm$^{-3}$, then the silicon grains in the doped amorphous silicon layer grow and a high concentration of n-type impurities is present in the vicinity of the silicon boundaries of the grown silicon grains, so that the resistance of the n-type impurity doped amorphous silicon layer increases locally and in turn image defects akin to a broken conductor may occur by inhibition of the flow of electrons in the doped amorphous silicon layer or due to electrons remaining in the doped amorphous silicon layer.

Figure 3A:
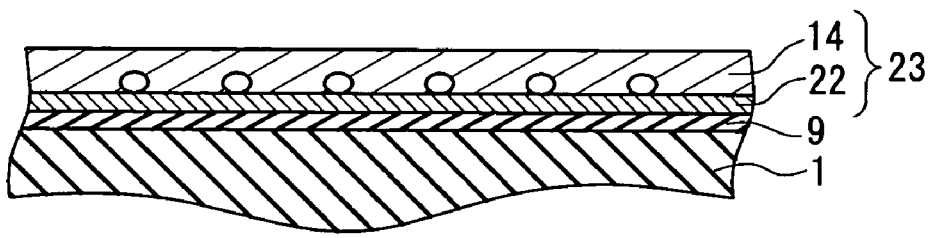
FIGS. 3A and 3B are cross-sectional views of a process in Embodiment 1 of the present invention.
Figure 3B:
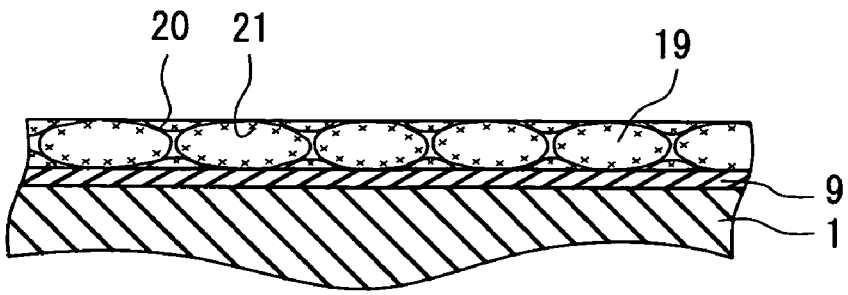

Alternatively, in a step of growing an n-type impurity doped amorphous silicon layer when forming a multilayer transfer gate electrode, a buffer layer 22 made of n-type impurity doped amorphous silicon is first formed as shown in FIGS. 3A and 3B. The thickness of the buffer layer 22 is 0.02 μm, for example, and the concentration of the buffer layer 22 is such that no microcrystal regions are formed locally (an undoped amorphous silicon layer or a doped amorphous silicon layer with an n-type impurity concentration of $7.0 \times 10^{20}$ cm$^{-3}$, for example). The buffer layer 22 is formed utilizing the thermal decomposition:

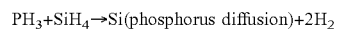

inside the LPCVD reactor.

Second, an n-type impurity doped amorphous silicon layer (first doped amorphous silicon layer) 14 of a desired n-type impurity concentration ($1.0 \times 10^{20}$ cm$^{-3}$ to $3.0 \times 10^{20}$ cm$^{-3}$, for example) is then formed in the same LPCVD reactor process. Thus, an n-type impurity doped amorphous silicon film 23 made of two or more amorphous silicon films with different n-type impurity concentration is formed. The averaged n-type impurity concentration of the n-type impurity doped amorphous silicon layer 23 is $1.0 \times 10^{20}$ cm$^{-3}$ to $3.0 \times 10^{20}$ cm$^{-3}$. This average n-type impurity concentration makes it possible to prevent or suppress growth of the silicon grains in the n-type impurity doped amorphous silicon layer, which may lead to a concentration of n-type impurities 21 that is higher than in the surroundings formed in the vicinity of the silicon boundaries of the grown silicon grains, and a high concentration of n-type impurities, when the n-type impurity doped amorphous silicon layer is subjected to the thermal diffusion in the next step.

As a result, though the n-type impurity concentration of the conventional n-type impurity doped amorphous silicon film is $7.0 \times 10^{20}$ cm$^{-3}$, it is possible to relatively lower the high concentration of the n-type impurities 21 by setting the average impurity concentration to $1.0 \times 10^{20}$ cm$^{-3}$ to $3.0 \times 10^{20}$ cm$^{-3}$. Therefore, it is possible to prevent or suppress the localized increase in the resistance of the n-type impurity doped amorphous silicon layer and in turn the image defects akin to a broken conductor since the flow of electrons in the n-type impurity doped amorphous silicon layer is not inhibited and the electrons do not remain in the n-type impurity doped amorphous silicon layer.

Also, first transfer gate electrodes can be manufactured by the following process after the gate insulating film 9 is formed on the entire surface of a silicon substrate 1, as shown in FIGS. 4A to 4G. A buffer layer 22 made of n-type impurity doped amorphous silicon is formed with the undoped amorphous silicon layer or the doped amorphous silicon layer with the n-type impurity concentration of $7.0 \times 10^{20}$ cm$^{-3}$, its thickness being approximately 0.02 μm.

Figure 4A:
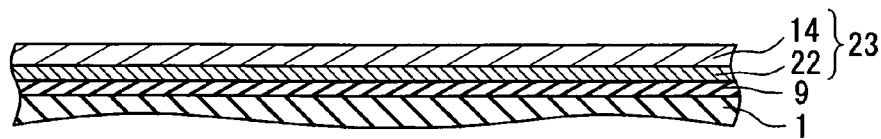
FIGS. 4A to 4G are cross-sectional views of a process in Embodiment 1 of the present invention.
Figure 4B:
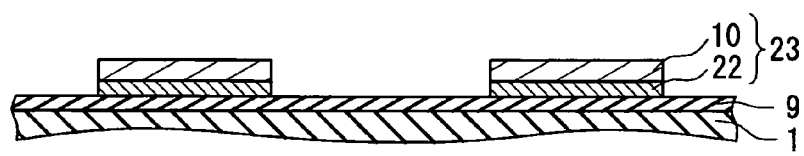

An n-type impurity doped amorphous silicon layer 14 of $2.0 \times 10^{20}$ cm$^{-3}$ with a thickness of approximately 0.5 μm is then formed and an n-type impurity doped amorphous silicon film 23 with at least two layers of n-type impurity concentration is formed (FIG. 4A). Then a first layer n-type impurity doped amorphous silicon transfer gate electrode is formed, leaving the n-type impurity doped amorphous silicon layer of a gate region and a gate wiring region, using photolithography and n-type impurity doped amorphous silicon etching (FIG. 4B).

Figure 4C:
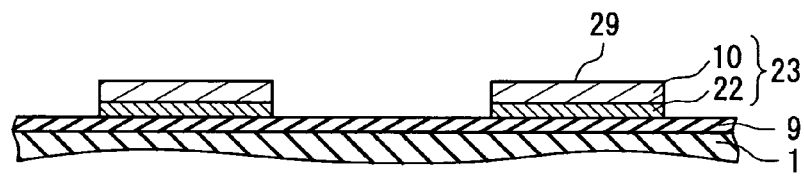
Figure 4D:
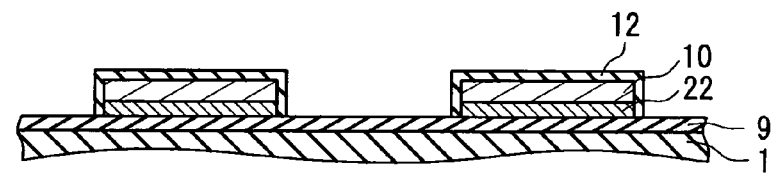

Next, as FIG. 4C shows, a step of diffusing n-type impurities 29 (by phosphorus (P) doping at approximately 10 to 20 minutes in a diffusion furnace at 900° C. with POCl$_3$, for example) at a higher concentration than that of the first layer n-type impurity doped amorphous silicon film into the surface after forming the first layer n-type impurity doped amorphous silicon transfer gate electrode is carried out. Subsequently, a silicon oxide film 12 is formed by subjecting the first layer n-type impurity doped amorphous silicon transfer gate electrode to thermal oxidation (in a furnace with an H$_2$O atmosphere at 850° C. to 900° C., for example) (FIG. 4D). Alternatively, the silicon oxide film 12 can also be formed by subjecting the first layer n-type impurity doped amorphous silicon transfer gate electrode to thermal oxidation using water that is formed by the reaction 2H$_2$+O$_2$→2H$_2$O at low pressure (under 1.33×10$^2$ Pa (1 Torr), 900° C., H$_2$ concentration 33%, for example).

Figure 4E:
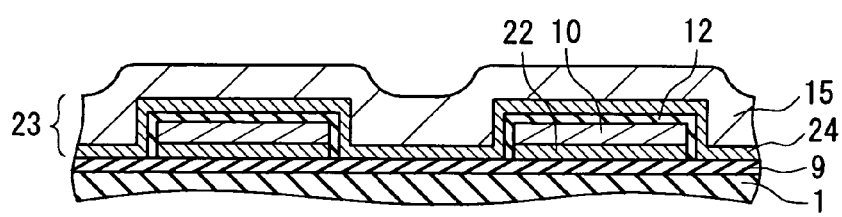
Figure 4F:
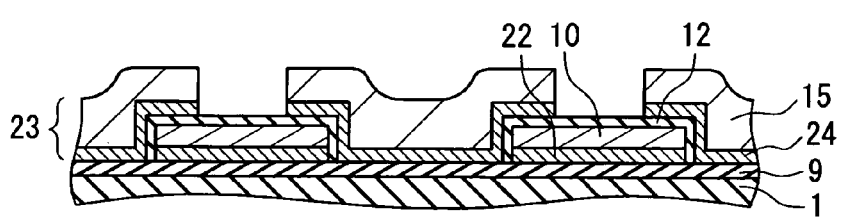

Next, second transfer gate electrodes are manufactured by the following process, as shown in FIGS. 4E to 4F. A buffer layer 24 made of n-type impurity doped amorphous silicon is formed with an undoped amorphous silicon layer or a doped amorphous silicon layer with an n-type impurity concentration of 7.0×10$^{20}$ cm$^{-3}$, its thickness being approximately 0.02 μm.

Subsequently, an n-type impurity doped amorphous silicon layer 15 with a concentration of 2.0×10$^{20}$ cm$^{-3}$ and a thickness of approximately 0.5 μm is formed and an n-type impurity doped amorphous silicon film 23 with two layers of the n-type impurity concentration is formed (FIG. 4E).

Then the second n-type impurity doped amorphous silicon transfer gate electrodes are formed, leaving the n-type impurity doped amorphous silicon layer of a gate region and a gate wiring region, using photolithography and n-type impurity doped amorphous silicon etching (FIG. 4F).

Figure 4G:
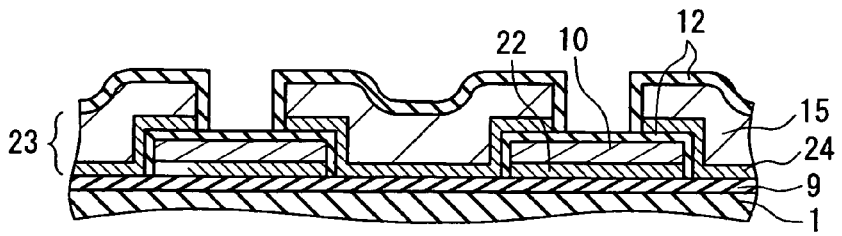

Next, as FIG. 4G shows, a step of diffusing n-type impurities (by phosphorus (P) doping at approximately 10 to 20 minutes in a diffusion furnace at 900° C. with POCl$_3$, for example) at a higher concentration than that of the second layer n-type impurity doped amorphous silicon film into the surface after forming the second layer n-type impurity doped amorphous silicon transfer gate electrode is carried out. Subsequently, a silicon oxide film 12 is formed by subjecting the second n-type impurity doped amorphous silicon transfer gate electrode to thermal oxidation (in a furnace with an H$_2$O atmosphere at 850° C. to 900° C., for example). Alternatively, the silicon oxide film 12 also can be formed by subjecting the second layer n-type impurity doped amorphous silicon transfer gate electrode to thermal oxidation using water that is formed by the reaction 2H$_2$+O$_2$→2H$_2$O at low pressure (under 1.33×10$^2$ Pa (1 Torr), 900° C., H$_2$ concentration 33%, for example).

Generally, the cause for a poor withstand voltage of oxide films formed on doped amorphous silicon (the same is true for polysilicon) is that the depressions and protrusions on the surface of the doped amorphous silicon at the interface portion of the doped amorphous silicon/oxide film after the thermal oxidation are large. Furthermore, another cause is that at protruding corner portions of the doped amorphous silicon, the oxidation is suppressed and the thickness of the oxide film in the region around the protruding corners becomes thin, because of concentration of the accumulated stress in the doped amorphous silicon oxide film.

In order to improve this problem, a method of performing oxidation at a temperature higher than 1000° C. has been proposed as a conventional means as described in (A) *J. Applied Phys., vol.* 48, p. 4834. According to this method, the mechanical distortions generated at the interface of the doped amorphous silicon and the oxide film are loosened and the protrusions and depressions at the interface can be reduced by oxidation at high temperature.

Also, a method of selecting the optimum concentration of phosphorus in the doped amorphous silicon or enlarging the crystal grain diameter of the doped amorphous silicon film and making the surface of the film smooth by performing annealing before oxidation has been proposed in (B) *J. Electrochem. Soc., vol.* 132, p. 2185.

Furthermore, a method of reducing the protrusions and depressions at the interface between the doped amorphous silicon and the oxide film and improving the withstand voltage by performing high temperature annealing after oxidation has been proposed in (C) *J. Electrochem. Soc.*, vol. 130, p. 1597.

However, these conventional methods (A) to (C) cannot be implemented, because these conventional methods all need the thermal process to be performed at a temperature higher than 1000° C., so that there is a restriction in terms of the depth of diffusion of the P-N junction when applying these conventional methods to the solid-state imaging devices.

This problem described is solved as follows.

(1) A step of diffusing n-type impurities (by phosphorus (P) doping at approximately 20 minutes in a diffusion furnace at 900° C., for example) at a higher concentration than that of the first layer n-type impurity doped amorphous silicon layer into the surface after forming the first n-type impurity doped amorphous silicon transfer gate electrode is carried out. Subsequently, the silicon oxide film is formed by subjecting the first layer n-type impurity doped amorphous silicon transfer gate electrode to thermal oxidation.

(2) The silicon oxide film is formed by subjecting the first n-type impurity doped amorphous silicon transfer gate electrode to thermal oxidation using water that is formed by the reaction 2H$_2$+O$_2$→2H$_2$O at low pressure (under 1.33×10$^2$ Pa (1 Torr), 900° C., H$_2$ concentration 33%, for example).

By the two methods described above, it is possible to make the interface of the oxide film/doped amorphous silicon smooth by fluidizing the silicon oxide film and alleviating the mechanical distortion of the oxide film/doped amorphous silicon interface generated by the oxidation.

Figure 5A:
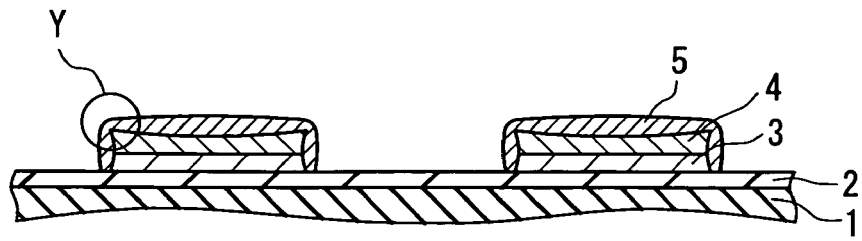
FIGS. 5A and 5B are cross-sectional views that illustrate protruding corner portions of a doped amorphous silicon oxide film.
Figure 5B:
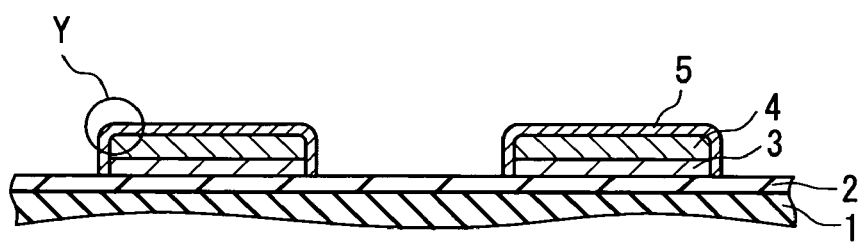
Figure 6:
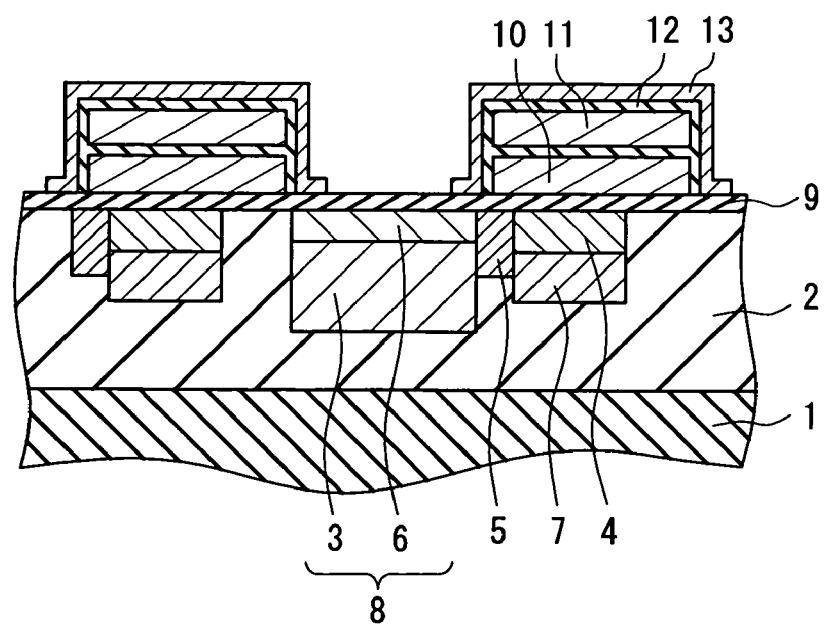
FIG. 6 is a cross-sectional view that illustrates a conventional manufacturing process.
Figure 7A:
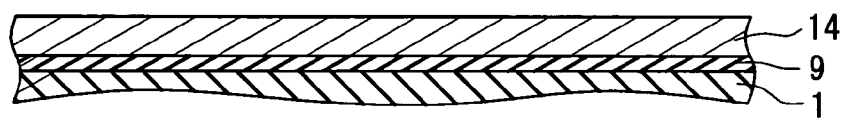
FIGS. 7A to 7D are cross-sectional views that illustrate a process of forming conventional first and second transfer gate electrodes.
Figure 7B:
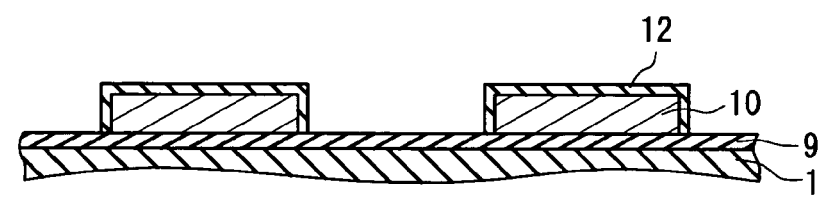
Figure 7C:
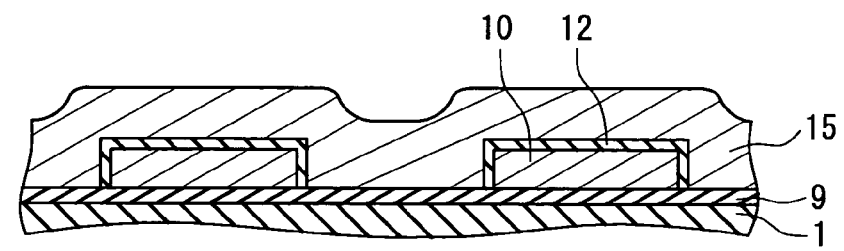
Figure 7D:
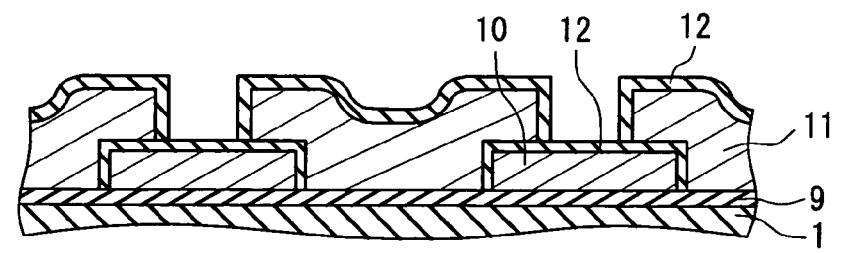

Furthermore, as FIGS. 5A and 5B shows, at the protruding corner portions Y of the doped amorphous silicon, the withstand voltage of the oxide film is improved because the concentrated stress accumulated in the doped amorphous silicon oxide film is improved by the viscous fluidity of the silicon oxide film, and the oxide film in vicinity of the protruding corner does not become thin, and the radius of curvature 6 of the protruding corner portions becomes larger.

Therefore, it is possible to prevent the leakage of light due to local thinning of the shield film and the interruption of the metal conductor at the step portion because the thickness of the oxide film can be made thinner and the level difference at the doped amorphous silicon electrode end portion can be reduced. Another advantage is a large improvement in performance as well as the yield of the device.

Second Embodiment

A solid-state imaging device of a second embodiment according to the present invention is explained with reference to FIG. 1.

An n-type impurity diffusion region 3, a vertical register 4, and a p-type channel stopper region 5 are formed on an n-type silicon substrate 1 inside a first p-type well region 2. A p-type positive charge accumulation region 6 is formed on the n-type impurity diffusion region 3. A second p-type well region 7 is formed below the vertical register 4. Here, a light-receiving portion (photoelectric conversion portion) 8 is configured by a photodiode that is made of a PN junction of the n-type impurity diffusion region 3 and the first p-type well region 2. The light-receiving portion 8 is formed in correspondence to a pixel. A gate insulating film 27 is formed on the entire surface, including the channel stopper region 5, the vertical register 4, and the positive charge accumulation region 6 of the first p-type well region 2. Furthermore, a first transfer gate electrode 10 and a second transfer gate electrode 11, made with doped amorphous silicon film, and a silicon oxide film 12, are formed on the gate insulating film 27 above the first p-type well region 2. A metal light-blocking film 13 shown in FIG. 1 is then selectively formed on the first transfer gate electrode 10, the second transfer gate electrode 11, and the silicon oxide film 12.

Here, at least one of the two transfer gate electrodes is provided with two impurity doped amorphous silicon layers of different impurity concentration. The bottom layer is formed by a buffer layer 22 made of undoped amorphous silicon layer or doped amorphous silicon layer with the n-type impurity concentration of $7.0 \times 10^{20}$ cm$^{-3}$, its thickness being approximately 0.02 μm. The top layer is formed by the n-type impurity doped amorphous silicon layer 10 of $2.0 \times 10^{20}$ cm$^{-3}$ with a thickness of approximately 0.5 μm. Also, the multilayer gate electrode is formed such that its averaged n-type impurity concentration is $1.0 \times 10^{20}$ cm$^{-3}$ to $3.0 \times 10^{20}$ cm$^{-3}$. 28 is a transparent resin layer.

It should be noted that it is also possible to configure the gate insulating film 9, made of $SiO_2$ film, with a 3-layer gate insulating film 27 of a $SiO_2$ film 9, a $Si_3N_4$ film 25, and a $SiO_2$ film 26, as shown in FIG. 1.

Figure 8A:
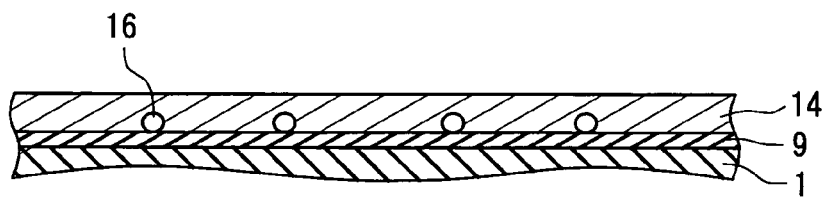
FIGS. 8A and 8B are cross-sectional views of a process that illustrate a first problem in the conventional process and FIG. 8C is a potential barrier diagram.
Figure 8B:
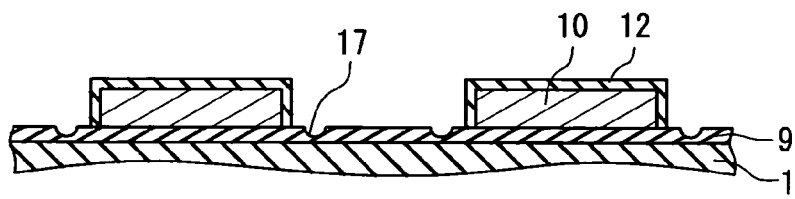
Figure 8C:
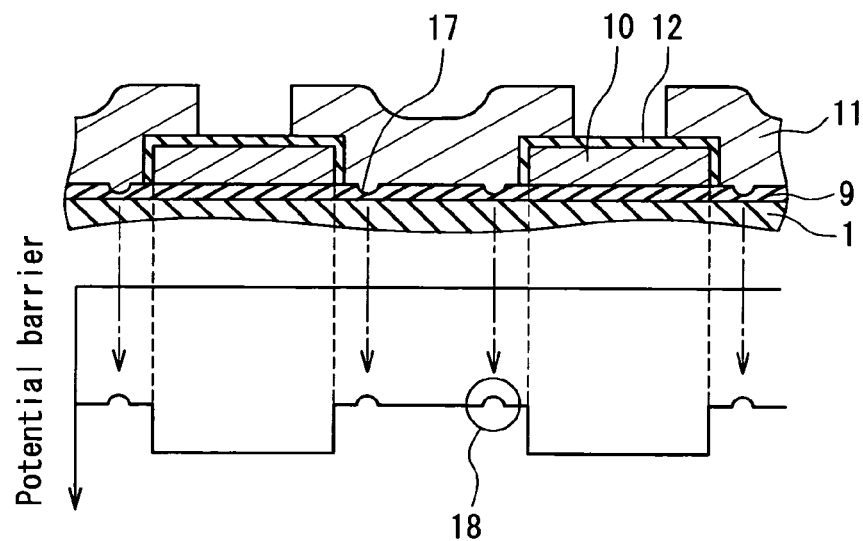
Figure 9A:
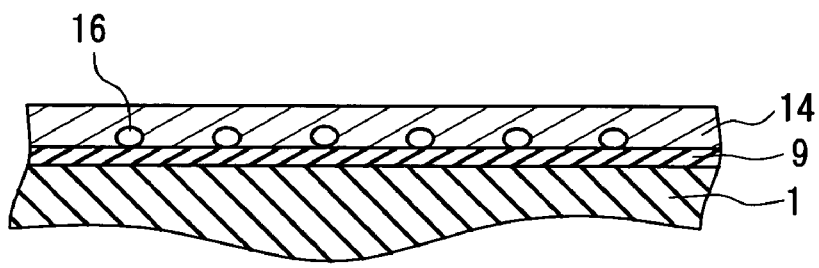
FIGS. 9A to 9B are cross-sectional views that describe a second problem in the conventional process.
Figure 9B:
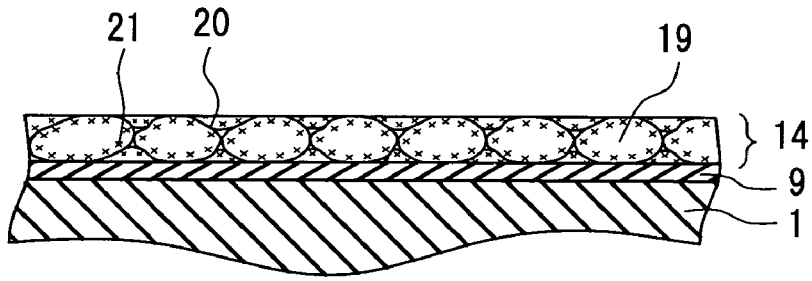

Thus, a potential barrier does not develop in the transfer channel because the microcrystal regions 16 in the n-type impurity doped amorphous silicon layers that are formed on the entire surface (FIG. 2) do not directly contact the gate insulating film 9 that is formed below and locally thin regions 17 on the gate insulating film 9 that is formed below (FIG. 8) are not formed when etching for the transfer gate electrode 10.

Also, it is possible to improve the yield by preventing the localized increase in the resistance of the n-type impurity doped amorphous silicon layer and the occurrence of the image defects akin to broken conductors due to inhibition of the flow of electrons in the doped amorphous silicon layer or due to electrons remaining in the doped amorphous silicon layer.

Also, it is possible to reduce the thickness of the n-type impurity doped amorphous silicon oxide film by improving the withstand voltage of the insulating film that is sandwiched between the electrodes made of the multilayered n-type impurity doped amorphous silicon. Furthermore, it is possible to prevent the leakage of light due to local thinning of the light-blocking film and the step interruption of the metal conductors, because the level difference at the doped amorphous silicon electrode end portion can be reduced.

Also, it is possible to improve the withstand voltage of the oxide film because the concentrated stress accumulated in the multilayer gate electrodes and the doped amorphous silicon oxide film is improved by viscous fluidity of the silicon oxide film, and the oxide film in vicinity of the protruding corner does not become thin, and the radius of curvature 6 of the protruding corner portions becomes larger.

INDUSTRIAL APPLICABILITY

The present invention can be applied to the gate electrode portion of solid-state imaging devices of the charge-transfer type.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a solid-state imaging device comprising a semiconductor substrate; a photoelectric conversion portion formed on the semiconductor substrate; a gate insulating film formed on the semiconductor substrate and covering the photoelectric conversion portion; a vertical transfer portion for transferring a charge generated at the photoelectric conversion portion in a vertical direction; and a multilayer transfer gate electrode for transferring the charge of the vertical transfer portion;

wherein at least one layer of the multilayer transfer gate electrode is made of at least two impurity doped amorphous silicon films of different impurity concentration; and wherein the impurity doped amorphous silicon films are formed by:

a step of forming a first doped amorphous silicon film with a first impurity concentration;

a step of etching the first doped amorphous silicon film into the shape of the transfer gate electrode;

a step of forming a second doped amorphous silicon film with a second impurity concentration; and a step of etching the second doped amorphous silicon film into the shape of the transfer gate electrode.

2. The method for manufacturing the solid-state imaging device according to claim 1, wherein at least one layer of the multilayer transfer gate electrode is further formed by:

a step of diffusing n-type impurities that are higher in concentration than that of the first and second doped amorphous silicon film into the surface of the transfer gate electrode; and a step of forming a silicon oxide film by thermally oxidizing the transfer gate electrode.

3. The method for manufacturing the solid-state imaging device according to claim 1, wherein at least one layer of the multilayer transfer gate electrode is further formed by:

a step of thermally oxidizing the transfer gate electrode using water that is formed by hydrogen and oxygen at low pressure.

4. The method for manufacturing the solid-state imaging device according to claim 1, wherein an average impurity concentration of the impurity doped amorphous silicon films is at least $1.0 \times 10^{20}$ cm$^{-3}$ and at most $3.0 \times 10^{20}$ cm$^{-3}$.

5. The method for manufacturing the solid-state imaging device according to claim 1, wherein the gate insulating film is formed in a 3-layer structure of a silicon oxide film, a silicon nitride film, and a silicon oxide film from the inward side.

6. The method for manufacturing the solid-state imaging device according to claim 1, wherein a metal light-blocking film is further formed on the outer silicon oxide film that makes up the gate insulating film.

7. The method for manufacturing the solid-state imaging device according to claim 1, wherein microcrystal regions in the n-type impurity doped amorphous silicon layer do not directly contact the gate insulating film.

8. The method for manufacturing the solid-state imaging device according to claim 1, wherein a difference in the impurity concentration between the impurity doped amorphous silicon films is at least $1.0 \times 10^{20}$ cm$^{-3}$ and at most $6.0 \times 10^{20}$ cm$^{-3}$.

* * * * *